United States Patent [19]
Krautschneider

[11] Patent Number: 5,854,500
[45] Date of Patent: Dec. 29, 1998

[54] DRAM CELL ARRAY WITH DYNAMIC GAIN MEMORY CELLS

[75] Inventor: Wolfgang Krautschneider, Hohenthann, Germany

[73] Assignee: Siemens Aktiengesellschaft, Munich, Germany

[21] Appl. No.: 721,546

[22] Filed: Sep. 26, 1996

[30] Foreign Application Priority Data

Sep. 26, 1995 [DE] Germany ................. 195 35 496.6

[51] Int. Cl.$^6$ .............. H01L 27/108; H01L 29/76; H01L 29/94; H01L 31/119
[52] U.S. Cl. ................. 257/300; 257/301; 257/330
[58] Field of Search ................. 257/300, 301, 257/302, 330, 333, 334

[56] References Cited

U.S. PATENT DOCUMENTS

| | | |
|---|---|---|
| 5,113,235 | 5/1992 | Tamakoshi . |
| 5,308,783 | 5/1994 | Krautschneider et al. . |
| 5,327,374 | 7/1994 | Krautschneider et al. ............ 365/145 |
| 5,559,357 | 9/1996 | Krivokapic ............... 257/336 |
| 5,661,322 | 8/1997 | Williams et al. ........... 257/331 |

FOREIGN PATENT DOCUMENTS

| | | |
|---|---|---|
| 0537203B1 | 9/1994 | European Pat. Off. . |
| 4417150A1 | 11/1995 | Germany . |
| 92/01287 | 1/1992 | WIPO . |

OTHER PUBLICATIONS

"Fully Scalable Gain Memory Cell for Future Drams" (Krautschneider et al.), Microelectronic Engineering 15, 1991, pp. 367–370, Elsevier.

"Planar Gain Cell for Low Voltage Operation and Gigabit Memories" Krautschneider et al., 1995 Symposium on VLSI Technology, Siemens AG Corporate Research and Development.

*Primary Examiner*—Olik Chaudhuri
*Assistant Examiner*—Howard Weiss
*Attorney, Agent, or Firm*—Herbert L. Lerner; Laurence A. Greenberg

[57] ABSTRACT

A dynamic gain memory cell of a DRAM cell array includes a planar MOS transistor as a selection transistor and a vertical MOS transistor as a memory transistor, which are connected to one another via a common source/drain region. The memory transistor has a gate electrode of doped silicon, which is disposed along at least one side of a trench. In the trench, an oppositely doped silicon structure is provided, which with the gate electrode of the memory transistor forms a diode, which is connected to the common source/drain region via a contact.

5 Claims, 2 Drawing Sheets

DRAM CELL ARRAY WITH DYNAMIC GAIN MEMORY CELLS

BACKGROUND OF THE INVENTION

Field of the Invention

The invention relates to an array of dynamic random access memory cells having dynamic gain.

As the memory density per chip increases from one memory generation to the next, the area of dynamic semiconductor memory cells has shrunk continuously. From the 4-Mbit memory generation on, three-dimensional structures have therefore been required. From the 64-Mbit memory generation on, memory capacity has attained a value that can hardly be reduced further, so that an approximately constant capacity must be provided on a reduced cell surface area. This entails considerable technological effort and expense.

In memory cells in which the signal charge is furnished not by a storage capacitor but by a supply voltage source, conversely, the level of the signal charge is not determined by the size of the storage capacity. In these memory cells it is sufficient to store only a lesser charge in the storage capacitor; when the memory cell is read out, this charge activates a switch element such that a conductive connection is made between the supply voltage source and the bit line. Such memory cells are known as self-amplifying memory cells or gain memory cells.

One such gain memory cell has been proposed for example in a paper by M. Terauchi, A. Nitayama, F. Horiguchi and F. Masuoka, entitled "A surrounding gate transistor (SGT) gain cell for ultra high density DRAMs", VLSI Symposium, Digital Technology Papers, p. 21, 1993. It includes an MOS transistor that surrounds a silicon column and a junction field effect transistor disposed below the MOS transistor. The transistor acts as a write-in transistor, while the junction FET acts as a readout transistor. For reading out and writing in information, two separate word lines are required in this memory cell, so that two word lines are provided for each memory cell.

In a paper by S. Shukuri, T. Kure, T. Kobayashi, Y. Gotoh and T. Nishida, entitled "A semistatic complementary gain cell technology for sub-1V supply DRAMs", IEEE Trans. Electron Dev., Vol. 41, p. 926, 1994, a gain memory cell is proposed that includes a planar MOS transistor and a thin-film transistor, complementary to it, disposed in a trench. The planar MOS transistor serves to write in information, and the thin-film transistor serves to read out information. The thin-film transistor includes a floating gate, which is acted upon by a charge when information is written in. The gate electrodes of both MOS transistors are connected to one word line. They are triggered with different polarity, so that the generation and switching of word line voltages involves expenditure for circuitry.

A dynamic MOS transistor gain memory cell is known from European Patent Disclosure EP 0 537 203 B1; it includes a selection transistor and a memory transistor. The charge in this memory cell is stored in the gate/source capacitor of the memory transistor. The two transistors are connected in series and have a common drain/source region. This common drain/source region is connected via a diode structure to the gate electrode of the memory transistor. On readout, the memory transistor is turned on in accordance with the information stored in memory in it, and it thereby closes a current path from a supply voltage to the bit line. In this cell type, selection transistors and memory transistors are connected in series, so that no special line is required to read out the signal. The selection transistors and memory transistors can be embodied as either planar MOS transistors or as vertical MOS transistors disposed in a trench. In one embodiment, the selection transistor is embodied as a planar MOS transistor and the memory transistor is embodied as a vertical MOS transistor, which is disposed on the edge of a trench. The two transistors are connected to one another via a common drain/source region. The gate electrode of the memory transistor is $n^+$-doped and is connected to the common drain/source region, which is n-doped, via a p-doped layer and a strap, that is, a conductive connection. The gate electrode and the common drain/source region form an $n^+$-p diode, in which the information is stored in memory. The contact between the gate electrode of the memory transistor and the common drain/source region is formed on the plane surface of the common drain/source region. The $n^+$-p diode structure has a small-area diode contact, whose surface area decreases further as the structural size of the planar selection transistor decreases.

SUMMARY OF THE INVENTION

It is accordingly an object of the invention to provide a DRAM cell array with dynamic gain memory cells, which overcomes the hereinafore-mentioned disadvantages of the heretofore-known devices of this general type and which has improved electrical properties.

With the foregoing and other objects in view there is provided, in accordance with the invention, a DRAM cell array wherein each memory cell of the DRAM cell array according to the invention includes a selection transistor, which is embodied as a planar MOS transistor, and a memory transistor, which is embodied as a vertical MOS transistor. The selection transistor and the memory transistor are connected to one another via a common source/drain region. A source/drain region of the memory transistor is connected to a supply voltage line. A source/drain region of the selection transistor is connected to a bit line. The source/drain region of the memory transistor, connected to the supply voltage line, acts as a drain region, while the source/drain region, connected to the bit line, of the selection transistor acts as a source region. The gate electrode of the selection transistor is connected to a word line. The memory transistor has a gate electrode of doped silicon, which is arranged along at least one side of a trench. Also disposed in the trench is a silicon structure, which is doped with the opposite conductivity type compared to the gate electrode of the memory transistor, and which forms a diode with the gate electrode of the memory transistor. Via a contact, the doped silicon structure is connected to the common source/drain region. The diode contact in the diode formed by the gate electrode of the memory transistor and the doped silicon structure extends over the surface of the gate electrode of the memory transistor. It is thus independent of the plane surface of the common source/drain region.

It is within the scope of the invention to embody both the gate electrode of the memory transistor and the silicon structure as spacers, which annularly line the sides of the trench. Thus the diode contact extends over the entire side wall surface of the trench. This provision additionally increases the capacity in which the information is stored. This improves the fault performance and increases the retention time for the stored information.

In another embodiment of the invention, many longitudinal trenches, extending essentially parallel, are provided in the substrate. The memory cells are arranged in a matrix such that the memory transistors, along one row of adjacent memory cells, border on opposite sides of the longitudinal trenches. Two selection transistors, each along one row of adjacent memory cells, are connected to one another via a common source/drain region, which is connected to a common bit line. Crosswise to the longitudinal trenches, isolation trenches are provided, which isolate adjacent memory cells from one another along a longitudinal trench. The isolation trenches each extend between adjacent rows of memory cells. In this DRAM cell array, an increased packing density is attained by providing that two memory transistors each border on opposite edges of the longitudinal trenches, and that adjacent memory cells are joined to one common bit line. The surface area of the diode contact is adjusted in this embodiment via the depth of the longitudinal trenches.

It is also within the scope of the invention to provide a dielectric layer between the gate electrode of the memory transistor and the doped silicon structure; this layer prevents dopant diffusion between the gate electrode and the silicon structure. By way of example, the dielectric layer may be formed of $SiO_2$. The dielectric layer may also be formed of nitrided oxide, and in that case it additionally produces an asymmetrical characteristic curve of the diode, which is advantageous in terms of storage properties.

With a view to increased packing density, it is advantageous to embody the contact between the silicon structure and the common source/drain region as a structure of metal silicide, which can be made self-adjusting to the gate electrode of the selection transistor.

In accordance with the invention there is further provided a DRAM cell array, in which a plurality of dynamic gain memory cells are provided, integrated in a substrate; and wherein each memory cell includes a selection transistor, which is embodied as a planar MOS transistor, and a memory transistor, which is embodied as a vertical MOS transistor; the selection transistor and the memory transistor are connected to one another via a common source/drain region; a source/drain region of the memory transistor is connected to a supply voltage line; a source/drain region of the selection transistor is connected to a bit line; the gate electrode of the selection transistor is connected to a word line; the memory transistor has a gate electrode of doped silicon, which is disposed along at least one side of a trench; and wherein a silicon structure doped with the opposite conductivity type is disposed in the trench, the silicon structure together with the gate electrode of the memory transistor forms a diode and is being connected to the common source/drain region via a contact.

According to a further feature, the DRAM cell array includes a dielectric layer disposed between the gate electrode of the memory transistor and the silicon structure.

According to a still further feature of the DRAM cell array the gate electrode of the memory transistor and the silicon structure are each embodied as spacers, which line the edges of the trench.

According to an additional feature of the invention the DRAM cell array includes a plurality of longitudinal trenches, which extend essentially parallel with each other, and are provided in the substrate; and wherein the memory cells are arranged in a matrix such that the memory transistors of adjacent memory cells border on opposed edges of the longitudinal trenches, and the memory transistors of adjacent memory cells are connected to one another via a common source/drain region, which is connected to a common bit line in which isolation trenches are provided crosswise to the longitudinal trenches and serve to insulate the adjacent memory cells, along a longitudinal trench, from one another.

According to still another feature, the DRAM cell array in which the contact between the silicon structure and the common source/drain region of the memory transistor is embodied as a contact hole filled with a high- melting-point metal; and according to a concomitant feature the DRAM cell array of the invention in which the contact between the silicon structure and the common source/drain region of the flat end memory transistor is embodied as a structure of metal silicide.

Although the invention is illustrated and described herein as embodied in a dram cell array with dynamic gain memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
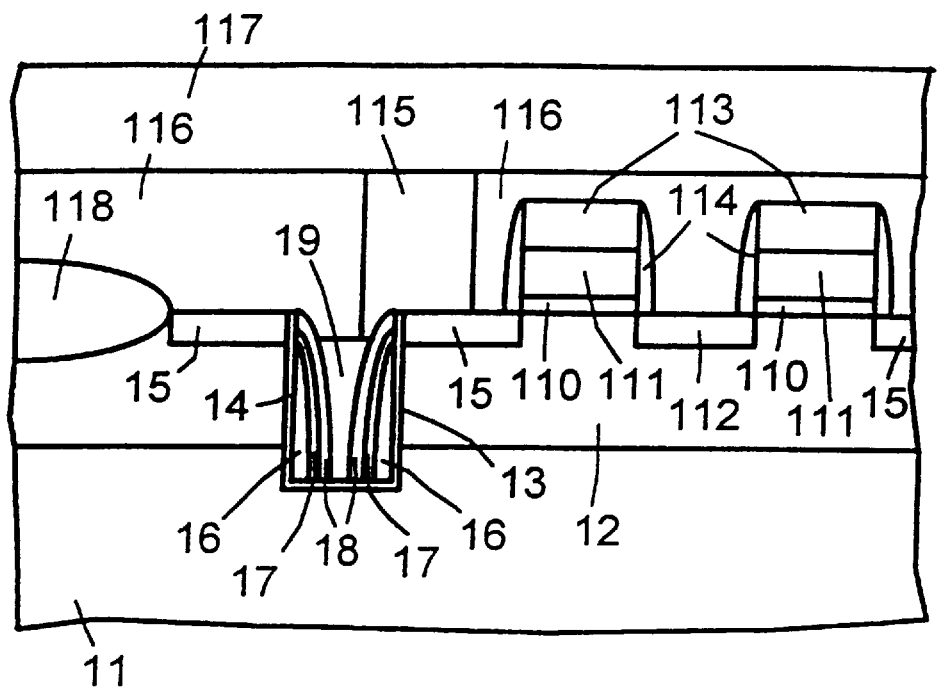
FIG. 1 shows a section through a dynamic gain memory cell with a memory transistor, whose gate electrode is embodied as a spacer and annularly lines the sides of a trench.

Referring now to the figures of the drawings in detail and first, particularly, to FIG. 1 thereof, there is seen a substrate 11 of monocrystalline silicon, for instance n-doped, which includes a p-doped region 12. The dopant concentration in the n-doped substrate 11 is $10^{16}$ cm$^{-3}$, for instance. The p-doped region 12 is embodied for instance as a p-doped well, with a dopant concentration of $5 \times 10^{17}$ cm$^{-3}$, or as a p-doped epitaxial layer with a dopant concentration of $10^{18}$ cm$^{-3}$. The p-doped region 12 has a depth of 0.5 μm, for example.

In the substrate 11 and in the p-doped region 12, a hole-shaped trench 13 is provided, which extends from the surface of the p-doped region 12 into the substrate 11. The trench 13 has a depth of 1 μm, for instance, and parallel to the surface it has dimensions of 0.2 μm, for instance. The surface of the trench 13 is provided with a first gate dielectric 14, for instance thermal oxide in a thickness of 7 nm. On the surface of the p-doped region 12, there is an annular n-doped region 15, which annularly surrounds the trench 13. Along the side walls of the trench 13, there is a first gate electrode 16, which annularly surrounds the trench 13. The first gate electrode 16 is embodied for instance of n$^+$-doped polysilicon in the form of a spacer. The first gate electrode 16 has a dopant concentration of $10^{20}$ cm$^{-3}$, for example.

The surface of the first gate electrode 16 is covered with a dielectric layer 17. The dielectric layer 17 has a thickness of from 1 to 2 nm, and by way of example it is formed of thermal oxide.

Arranged on the surface of the dielectric layer 17 is a silicon structure 18, formed for example from p-doped polysilicon in the form of a spacer. The silicon structure 18 is essentially flush with the surface of the n-doped region 15. The p-doped silicon structure 18 has a dopant concentration in the range between $5 \times 10^{16}$ cm$^{-3}$ and $5 \times 10^{18}$ cm$^{-3}$. The doped silicon structure 18 likewise annularly surrounds the trench. The first gate electrode 16 and the doped silicon structure 18 form a diode in which a dopant exchange between the first gate electrode 16 and the doped silicon structure 18 is prevented by the dielectric layer 17 located between them. An insulation structure 19 is provided in the trench 13, inside the doped silicon structure 18; it ends at the level below the surface of the n-doped region 15, so that at the rim of the trench 13 the surface of the doped silicon structure 18 is not covered by the insulation structure 19. The insulation structure 19 is of BPSG, for instance. A second gate dielectric 110, a second gate electrode 111 and a further n-doped region 112 are provided laterally of the trench 13. The second gate electrode 111 is formed of n$^+$-doped polysilicon, for instance. The second gate electrode 111 is covered with an insulation layer 113, for example of SiO$_2$. The sides of the second gate electrode 111 and of the insulation layer 113 are covered by insulating spacers 114. The insulating spacers 114 are formed of SiO$_2$, for example.

The portion of the n-doped region 15 located between the trench 13 and the second gate electrode 111, together with the p-doped region 12, the second gate dielectric 110, the second gate electrode 111 and the further n-doped region 112, form a selection transistor. The n-doped region 15, the first gate dielectric 14, the first gate electrode 16, the p-doped region 12 and the substrate 11 form a memory transistor. The portion of the n-doped region 15 located between the trench 13 and the second gate electrode 111 forms a common source/drain region, by way of which the memory transistor and the selection transistor are connected in series. The first gate electrode 16 and the doped silicon structure 18 form a diode. The doped silicon structure 18 is electrically connected to the common source/drain region via a contact 115, for example of tungsten. By way of example the contact 115 is embodied as a tungsten-filled contact hole in a first intermediate oxide layer 116, which covers the second gate electrode 111 and the insulation layer 113. A second intermediate oxide layer 117 covers the structure. The memory transistor and the selection transistor form a memory cell.

Figure 2:
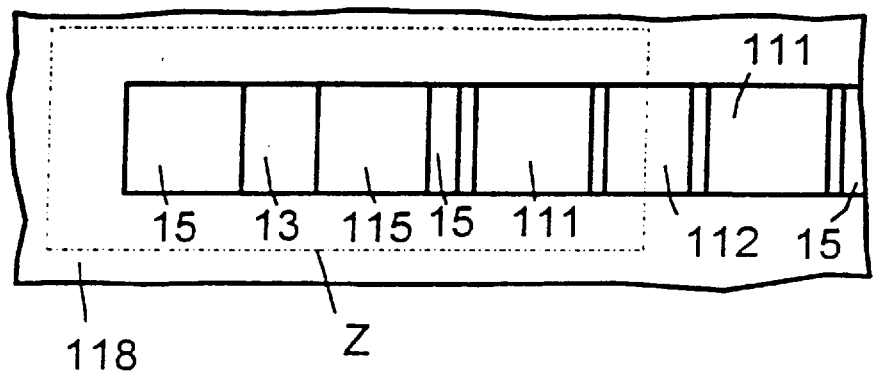
FIG. 2 shows a plan view on the gain memory cell shown in FIG. 1.

Many identical memory cells are arranged in a matrix in the DRAM cell array. The memory cell shown in FIG. 1 is adjoined by a mirror-symmetrical memory cell, and the further n-doped region 112 belongs to both of these memory cells. In the DRAM cell array, the further n-doped region 112 is connected to a bit line, the second gate electrode 111 to a word line, and the substrate 11 to a supply voltage line. Two adjacent memory cells with one common further n-doped region 112 are insulated from the adjacent memory cells by an insulation structure 118. By way of example, the insulation structure 118 is embodied as LOCOS isolation or shallow trench isolation. It is adjacent to the n-doped region 15 and surrounds the two mirror-symmetrical memory cells annularly (see the plan view in FIG. 2).

To produce the memory cell, a p-doped well is made by implantation in the n-doped substrate 11 to form the p-doped region 12, or a p-doped layer is applied to the substrate by epitaxial deposition. The trench 13 is formed by masked etching. The first gate dielectric 14 is formed on the surface of the trench 13 by thermal oxidation.

By creating an n$^+$-doped first polysilicon layer by in-situ doped deposition or by undoped deposition an ensuing phosphorus diffusion and ensuing anisotropic back-etching of the first polysilicon layer, a first gate electrode 16 in the form of a spacer is formed on the side walls of the trench 13. In the process, the first polysilicon layer is removed entirely from planar regions. The first gate electrode 16 is not flush in height with the trench 13. The edges of the trench 13 are freely exposed above the first gate electrode 16, for example for 50 nm.

By thermal oxidation of the surface of the first gate electrode 16, the dielectric layer 17 is formed. Next, a p-doped polysilicon layer is created by in-situ doped deposition or by undoped deposition and ensuing inclined implantation of boron, with an angle of inclination of from 7 to 25. If the second doped polysilicon layer is doped by implantation, then the trench mask must still be present during the implantation, in order to shield the surface. After the dopant atoms are activated, for example using RTA (rapid thermal annealing), then, by anisotropic back-etching, the second polysilicon layer is removed from planar regions and the doped silicon structure 18 is formed as a spacer.

By deposition of a layer of boron phosphorus glass (BPSG) and causing the boron phosphorus glass layer to flow, the insulation structure 19 is created in the trench 13.

By thermal oxidation, the second gate dielectric 110 is then formed for the selection transistor. By deposition of a third polysilicon layer and structuring of the third polysilicon layer with the aid of photolithographic process steps, the second gate electrode 111 is formed. The insulation layer 113 is formed by deposition of an SiO$_2$ layer and forming of the SiO$_2$ layer. The forming of the SiO$_2$ layer and of the third polysilicon layer can be done simultaneously.

By deposition of an SiO$_2$ layer and anisotropic back-etching of the SiO$_2$ layer, the insulating spacers 114 are formed on the sides of the second gate electrode 111 and of the insulation layer 113. The n-doped region 15 and the further n-doped region 112 are formed by masked implantation.

The first intermediate oxide layer 116 is deposited, for instance in a thickness of 600 nm to 800 nm. After the first intermediate oxide layer 116 is made to flow, a contact hole is opened and filled with tungsten in order to form the contact 115 in the first intermediate oxide layer 116. If the surface of the insulating spacer 114 has silicon nitride, or if the insulating spacer 114 entirely comprises silicon nitride, then the opening of the contact hole can be done in self-adjusted fashion to the second gate electrode 111. Next, the second intermediate oxide layer 117 is deposited in a thickness of 400 nm to 800 nm and planarized by being made to flow.

The production process is concluded by contact hole etching for the bit line contact and by a standard metallization (not shown).

Figure 3:
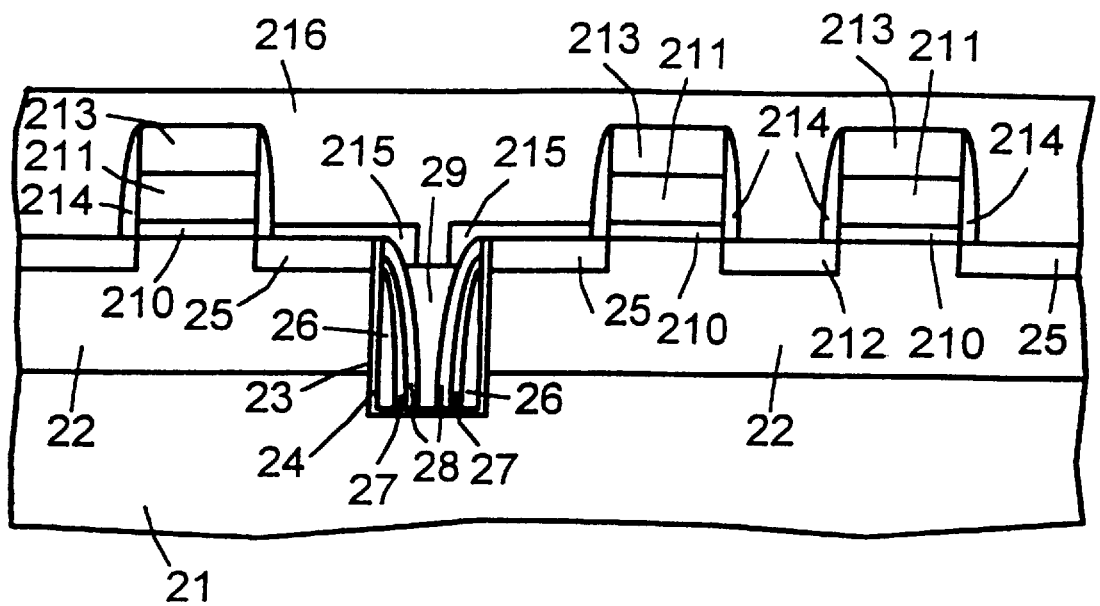
FIG. 3 shows a section through a dynamic gain memory cell with a memory transistor, which is disposed along one side of a longitudinal trench.

A substrate 21 of monocrystalline silicon, for instance n-doped, includes a p-doped region 22 (see FIG. 3). The n-doped substrate 21 has a dopant concentration of $10^{16}$ cm$^{-3}$, for instance. The p-doped region 22 has a dopant concentration of $5 \times 10^{17}$ cm$^{-3}$ to $5 \times 10^{18}$ cm$^{-3}$, for instance. The p-doped region 22 has a depth of 0.5 $\mu$m, for instance.

The substrate 21 includes longitudinal trenches 23, which extend substantially parallel to each other and have a depth of 1 $\mu$m, for instance, and which subdivide the p-doped region 22 into striplike regions. The longitudinal trenches 23 extend over one block of the cell field and have a length of 80 $\mu$m, for instance, and a width of 0.3 $\mu$m, for instance. The surface of the longitudinal trench 23 is covered by a first gate dielectric 24, such as $SiO_2$. A first gate electrode 26, of for instance $n^+$-doped polysilicon, is disposed on one side of the longitudinal trench 23. The first gate electrode 26 extends from the bottom of the longitudinal trench 23 as far as a defined distance below the upper edge of the longitudinal trench 23. The surface of the first gate electrode 26 is covered by a dielectric layer 27, for example of thermal oxide or nitrided oxide in a thickness of 1 to 2 nm. A p-doped silicon structure 28 is disposed on the surface of the dielectric layer 27, extending from the bottom of the longitudinal trench 23 to the surface of the substrate 21 having the p-doped region 22.

Laterally of the first gate electrode 26, an n-doped region 25 and, laterally offset from it, an $n^+$-doped region 212 are disposed in the surface of the p-doped region 22. The n-doped region 25 borders on the side of the longitudinal trench 23. Between the n-doped region 25 and the $n^+$-doped region 212, the surface of the p-doped region 22 is provided with a second gate dielectric 210 and a second gate electrode 211. The second gate electrode 211 is covered with an insulation layer 213, for instance of $SiO_2$ or $Si_3N_4$. The sides of the second gate electrode 211 and of the insulation layer 213 are covered by insulating spacers 214, for instance of $SiO_2$ or $Si_3N_4$.

The longitudinal trench 23 is provided with an insulation structure 29, for instance of BPSG. The insulation structure 29 does not fill the longitudinal trench 23 completely, so that in the upper region the surface of the doped silicon structure 28 remains uncovered by the insulation structure 29. On the surface of the n-doped region 25 and on the surface of the doped silicon structure 28 not covered by the insulation structure 29, there is a contact 215, embodied as a structure of metal silicide, such as titanium silicide.

The n-doped region 25, the second gate dielectric 210, the second gate electrode 211, and the $n^+$-doped region 212 form a selection transistor. The n-doped region 25, the first gate dielectric 24, the first gate electrode 26 and the substrate 21 forms a memory transistor. The n-doped region 25 forms a common source/drain region for the memory transistor and for the selection transistor, by way of which these transistors are connected in series. The first gate electrode 26 and the doped silicon structure 28 form a diode. The doped silicon structure 28 is connected to the common source/drain region 25 via the contact 215. The $n^+$-doped region 212 is connected to a bit line, the second gate electrode 211 to a word line, and the substrate 21 to a supply voltage line. The connection of the substrate 21 to the supply voltage line is effected from the back side or via a buried contact laterally of the cell field.

In the DRAM cell array, the memory cells are arranged in a matrix in rows and columns. Along one row, adjacent memory cells are arranged in mirror symmetry. The selection transistors of memory cells arranged along one row are disposed on opposite sides of one and the same longitudinal trench 23. The $n^+$-doped regions 212 of the selection transistors of memory cells adjacent along one row abut one another and are embodied as a common $n^+$-doped region 212. Accordingly, the common $n^+$-doped region 212 is connected to a common bit line.

Figure 4:
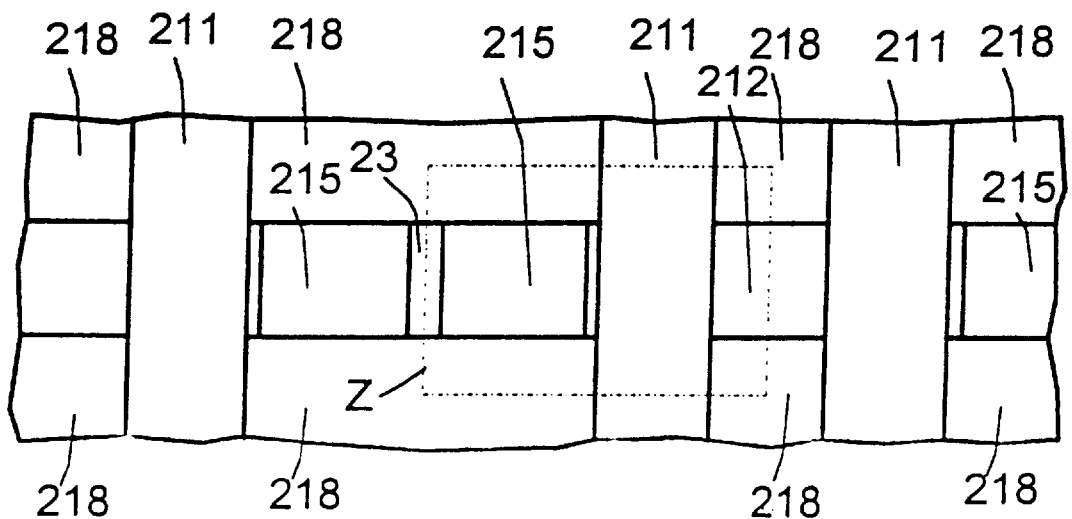
FIG. 4 shows a plan view of the gain memory cell shown in FIG. 3.

Adjacent rows are insulated from one another by insulation trenches 218 (see the plan view of FIG. 4). The isolation trenches 218 are embodied such that they reliably separate the n-doped regions 25, the $n^+$-doped regions 212, the first gate electrodes 26 and the doped silicon structures 28 of adjacent memory cells along one column. The insulation trenches 218 are embodied for example as trenches extending crosswise to the longitudinal trenches 23, with a depth at least equivalent to the depth of the longitudinal trenches 23 and filled with insulating material. Alternatively, the insulation trenches 218 are embodied as trenches extending crosswise to the longitudinal trenches 23, with a depth greater than the depth of the n-doped regions 25 and the $n^+$-doped regions 212, but extending only into the p-doped region 22, and are filled with insulating material. In that case, the first gate electrodes 26 and the doped silicon structure 28 are structured in a manner corresponding to the isolation trenches 218, so that the first gate electrodes 26 and the doped silicon structures 28 are reliably separated along one column of adjacent memory transistors.

The DRAM cell array is covered by an intermediate oxide layer 216, on which bit lines (not shown) are arranged that are connected to the $n^+$-doped regions 212 via bit line contacts in the intermediate oxide layer 216.

To produce the memory cell array explained in conjunction with FIGS. 3 and 4, the p-doped region 22 is created in the n-doped substrate 21 by implantation as a p-doped well or by epitaxial deposition of a p-doped layer. Next, a trench mask is created with the aid of photolithographic process steps. The longitudinal trenches 23 are etched to a depth of 1 $\mu$m. By thermal oxidation, the first gate dielectric 24 is formed on the surface of the longitudinal trenches 23.

Next, a first doped polysilicon layer is created, from which the spacer-like first gate electrode of $n^+$-doped polysilicon is formed by back-etching. The first doped polysilicon layer is either deposited with in-situ doping or is deposited undoped and then doped by ensuing phosphorus diffusion. The back-etching is continued until the first gate electrode 26 terminates between the plane surface of the p-doped region 22.

The dielectric layer 27 is then created, for instance by thermal oxidation, in a thickness of 1 to 2 nm. Next, a second doped polysilicon layer is created. This is done either by in-situ doped deposition or by undoped deposition with ensuing implantation of boron with an angle of inclination of 7 to 25. In the implantation, the trench mask must still be present in order to shield the plane surface. The dopants are then activated with the aid of RTA (rapid thermal annealing). The doped silicon structure 28 is created as a spacer from the second doped polysilicon layer by anisotropic back-etching.

Next, the insulation trenches 218 are formed. To that end, with the aid of photolithographic process steps, a mask is created that defines the course of trenches crosswise to the longitudinal trenches 23. With the aid of this mask, the doped polysilicon structure 28, which up to this process step is embodied as one continuous spacer for all the adjacent selection transistors along one side of a longitudinal trench 23, is formed in a dry etching step, until the surface of the dielectric layer 27 is exposed. Next, with the aid of the same mask, the dielectric layer 27 is etched either dry or by wet chemical processes. Finally, the first gate electrodes 26 are formed in a dry etching process, using the same mask. For insulating the selection transistors, a trench is etched crosswise to the longitudinal trenches 23 that extends into the p-doped region 22 and that separates the n-doped regions 25 and $n^+$-doped regions 212 of adjacent selection transistors from one another and is filled with deposited $SiO_2$.

Alternatively, to form the isolation trenches 218, striplike trenches are etched which extend crosswise to the longitudinal trenches 23 and are at least as deep as the longitudinal trenches 23. These trenches are filled by the deposition of a boron phosphorus silicate glass layer, which is made to flow and then is back-etched. In this process, the insulation structure 29 is also formed, between doped silicon structures 28 located on opposite sides of a longitudinal trench 23.

By thermal oxidation, the second gate dielectric 210 is then created for the planar selection transistors.

A third polysilicon layer is deposited and formed in a dry etching step, with the aid of photolithographic process steps, to form the second gate electrode 211. The surface of the second gate electrode 211 is provided with the insulation layer 213. At the sides, insulating spacers 214 are formed by deposition of an $SiO_2$ layer and anisotropic back-etching. To form the contact 215, the structure of metal silicide is created selectively, by deposition of a metal layer and a subsequent siliciding reaction at the exposed surface of the doped silicon structure 28 and of the n-doped region 25. No silicide forms in this process at the surface of the insulating spacers 214, the insulation layer 213, and the insulation structure 29. After the siliciding reaction, the metal that has not reacted is removed selectively in these portions down to the metal silicide. Next, the intermediate oxide layer 216 of boron phosphorus silicate glass is deposited, in a thickness of 1000 nm, for instance. In this embodiment, only one intermediate oxide layer is required. Contact hole etching to form the contact between the doped silicon structure and the n-doped region is omitted.

The production of the DRAM cell array is concluded with contact hole etching for the bit line contact, contact hole filling, and standard metallization.

I claim:

1. A DRAM cell array, comprising:

a plurality of dynamic gain memory cells, integrated in a substrate;

a selection transistor included in each memory cell formed as a planar MOS transistor, and a memory transistor formed as a vertical MOS transistor;

a common source/drain region connecting the selection transistor and the memory transistor to one another;

a source/drain region of the memory transistor being connected to a supply voltage line;

a source/drain region of the selection transistor being connected to a bit line;

a gate electrode of the selection transistor being connected to a word line;

a gate electrode of doped silicon in the memory transistor disposed along at least one side of a longitudinal trench; and a silicon structure being doped with the opposite conductivity type of said gate electrode and being disposed in the trench, said silicon structure together with said gate electrode of the memory transistor forming a diode and being connected to said common source/drain region via a contact, and wherein said gate electrode of the memory transistor and said silicon structure are each formed as spacers, which line the sides of said trench.

2. The DRAM cell array according to claim 1, having a dielectric layer disposed between said gate electrode of the memory transistor and said silicon structure.

3. The DRAM cell array according to claim 1, having a plurality of mutually parallel longitudinal trenches disposed in the substrate;

wherein said memory cells are arranged in a matrix such that each memory transistor of adjacent memory cells border on opposite sides of the longitudinal trenches, each memory transistor of adjacent memory cells being connected to one another via a common source/drain region, said source/drain region being connected to a common bit line; and a plurality of insulation trenches disposed perpendicular to the longitudinal trenches for insulating adjacent memory cells, disposed along a longitudinal trench, from one another.

4. The DRAM cell array according to claim 1, including a contact disposed between said silicon structure and said source/drain region common to said selection transistor and said memory transistor, said contact formed as a contact hole filled with a high- melting-point metal.

5. The DRAM cell array according to claim 1, including a contact disposed between said silicon structure and said source/drain region common to said selection transistor and said memory transistor, said contact including a structure formed of metal silicide.

* * * * *